United States Patent
Disney et al.

(10) Patent No.: US 8,829,574 B2
(45) Date of Patent: Sep. 9, 2014

(54) METHOD AND SYSTEM FOR A GAN VERTICAL JFET WITH SELF-ALIGNED SOURCE AND GATE

(75) Inventors: Donald R. Disney, Cupertino, CA (US); Isik C. Kizilyalli, San Francisco, CA (US); Hui Nie, Cupertino, CA (US); Linda Romano, Sunnyvale, CA (US); Richard J. Brown, Los Gatos, CA (US); Madhan Raj, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 29 days.

(21) Appl. No.: 13/334,514

(22) Filed: Dec. 22, 2011

(65) Prior Publication Data

US 2013/0161705 A1 Jun. 27, 2013

(51) Int. Cl.
*H01L 29/808* (2006.01)
*H01L 21/335* (2006.01)
*H01L 29/66* (2006.01)
*H01L 29/78* (2006.01)

(52) U.S. Cl.
CPC .... *H01L 29/66893* (2013.01); *H01L 29/66916* (2013.01); *H01L 29/66909* (2013.01); *H01L 29/7832* (2013.01); *H01L 29/8086* (2013.01)
USPC ........... 257/263; 257/328; 257/329; 257/330; 257/E21.447; 257/E29.313; 257/E29.314; 438/192

(58) Field of Classification Search
CPC ............ H01L 29/7832; H01L 29/8086; H01L 29/8128; H01L 29/66893; H01L 29/66916
USPC .......... 257/328, 329, 330, E21.447, E29.313, 257/E29.314, 263; 438/192
See application file for complete search history.

(56) References Cited

U.S. PATENT DOCUMENTS

| | | | |
|---|---|---|---|
| 5,654,238 A | 8/1997 | Cronin et al. | |
| 5,753,938 A * | 5/1998 | Thapar et al. | 257/77 |
| 7,719,080 B2 * | 5/2010 | Zhang | 257/510 |
| 2003/0089930 A1 | 5/2003 | Zhao | |
| 2003/0205657 A1 | 11/2003 | Voisin | |
| 2005/0145883 A1* | 7/2005 | Beach et al. | 257/194 |
| 2009/0111227 A1* | 4/2009 | Kocon et al. | 438/259 |
| 2010/0032683 A1 | 2/2010 | Ikeda et al. | |
| 2011/0042728 A1 | 2/2011 | Cheng et al. | |

OTHER PUBLICATIONS

Notification Of Transmittal Of The International Search Report And The Written Opinion Of The International Searching Authority, Or The Declaration; International Search Report and Written Opinion Of The International Searching Authority for corresponding International application No. PCT/US2012/069299 mailed on Feb. 11, 2013, 9 pages.

* cited by examiner

*Primary Examiner* — Dao H Nguyen
(74) *Attorney, Agent, or Firm* — Kilpatrick Townsend & Stockton LLP

(57) ABSTRACT

A semiconductor device includes a III-nitride substrate, a first III-nitride epitaxial layer coupled to the III-nitride substrate and having a mesa, and a second III-nitride epitaxial layer coupled to a top surface of the mesa. The semiconductor device further includes a III-nitride gate structure coupled to a side surface of the mesa, and a spacer configured to provide electrical insulation between the second III-nitride epitaxial layer and the III-nitride gate structure.

6 Claims, 16 Drawing Sheets

US 8,829,574 B2

METHOD AND SYSTEM FOR A GAN VERTICAL JFET WITH SELF-ALIGNED SOURCE AND GATE

CROSS-REFERENCES TO RELATED APPLICATIONS

The following regular U.S. patent applications are incorporated by reference into this application for all purposes: application Ser. No. 13/198,655, filed Aug. 4, 2011, entitled "METHOD AND SYSTEM FOR GAN VERTICAL JFET UTILIZING A REGROWN GATE"; and application Ser. No. 13/198,659, filed Aug. 4, 2011, entitled "METHOD AND SYSTEM FOR A GAN VERTICAL JFET UTILIZING A REGROWN CHANNEL."

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming a vertical junction field-effect transistor (JFET) using self-aligned techniques. Merely by way of example, the invention has been applied to methods and systems for manufacturing vertical JFETs using gallium-nitride (GaN) based epitaxial layers. The methods and techniques can be applied to a variety of compound semiconductor systems including n-channel and p-channel vertical JFETs, which can provide either normally-off or normally-on functionality.

According to one embodiment of the present invention a method for fabricating a vertical JFET is provided. The method includes providing a III-nitride substrate of a first conductivity type, forming a first III-nitride epitaxial layer of the first conductivity type coupled to the III-nitride substrate, and forming a second III-nitride epitaxial layer of the first conductivity type coupled to the first III-nitride epitaxial layer. The method also includes forming a first masking layer coupled to the second III-nitride epitaxial layer, and removing at least a portion of the first masking layer and the second III-nitride epitaxial layer to expose a vertical sidewall of the second III-nitride epitaxial layer and a horizontal surface of the first III-nitride epitaxial layer. The method further includes forming a spacer coupled to the vertical sidewall of the second III-nitride epitaxial layer and the horizontal surface of the first III-nitride epitaxial layer; and removing at least a portion of the first III-nitride epitaxial layer to form a channel region of the vertical JFET, wherein the spacer is used as an etch mask.

According to another embodiment of the present invention, a semiconductor device is provided. The semiconductor device includes a III-nitride substrate, a first III-nitride epitaxial layer coupled to the III-nitride substrate and having a mesa, and a second III-nitride epitaxial layer coupled to a top surface of the mesa. The semiconductor device further includes a III-nitride gate structure coupled to a side surface of the mesa, and a spacer configured to provide electrical insulation between the second III-nitride epitaxial layer and the III-nitride gate structure.

According to yet another embodiment of the present invention, a method for fabricating a vertical JFET is provided. The method includes providing a III-nitride substrate, forming a first III-nitride epitaxial layer having a first surface coupled to the III-nitride substrate and a second surface substantially opposite the first surface, and forming a second III-nitride epitaxial layer coupled to the second surface of the first III-nitride epitaxial layer. The method also includes removing at least a portion of the second III-nitride epitaxial layer and the first III-nitride epitaxial layer to form a trench. The trench has at least one sidewall disposed at an angle with respect to a dimension normal to the second surface. The method further includes forming an insulating layer coupled to the at least one sidewall, removing a portion of the insulating layer to expose a portion of the at least one sidewall, and forming a III-nitride gate structure coupled to the portion of the at least one sidewall such that a portion of the insulating layer is disposed between the III-nitride gate structure and the second III-nitride epitaxial layer.

Numerous benefits are achieved by way of the present invention over conventional techniques. For example, embodiments of the present invention enable the manufacture of vertical JFETs using self-aligned techniques that can reduce the amount of photolithography and removal (e.g., etching) steps, in addition to helping ensure accurate placement of the source and gate. Additionally, embodiments of the present invention provide insulation between the source and gate of a vertical JFET, helping reduce leakage current and enabling better performance in general. These and other embodiments of the invention, along with many of its advantages and features, are described in more detail in conjunction with the text below and attached figures.

Figure 1:
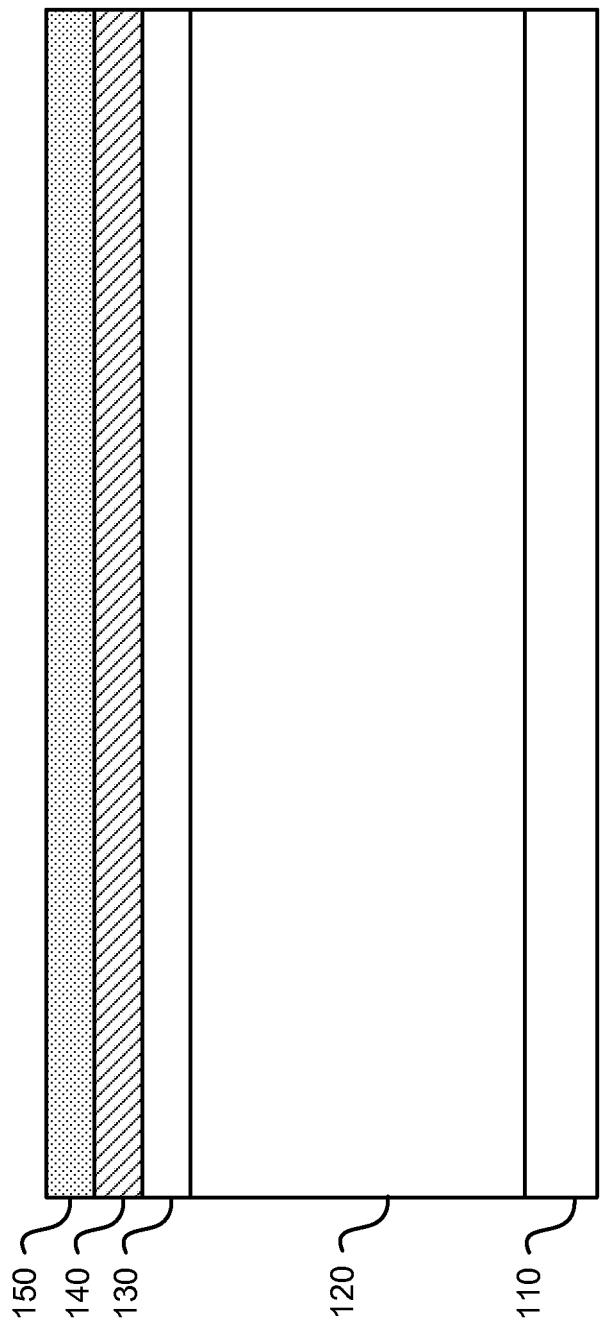
FIGS. 1-9 are simplified cross-sectional diagrams illustrating the fabrication of a vertical junction field-effect transistor (JFET) according to an embodiment of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

Embodiments of the present invention relate to electronic devices. More specifically, the present invention relates to forming a vertical junction field-effect transistor (JFET) using self-aligned techniques. Merely by way of example, the invention has been applied to methods and systems for manufacturing vertical JFETs using gallium-nitride (GaN) based epitaxial layers. The methods and techniques can be applied to a variety of compound semiconductor systems including n-channel and p-channel vertical JFETs, which can provide either normally-off or normally-on functionality.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudo-bulk GaN substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on bulk GaN substrates, on the other hand, are utilized in the embodiments described herein to provide superior properties to conventional techniques and devices. For instance, electron mobility, $\mu$, is higher for a given background doping level, N. This provides low resistivity, $\rho$, because resistivity is inversely proportional to electron mobility, as provided by equation (1):

$$\rho = \frac{1}{q\mu N}, \quad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \quad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

Among the vertical device structures contemplated is a vertical JFET. Depending on doping levels, physical dimensions, conductivity type (e.g., n-type or p-type materials), and other factors, vertical JFETs can be designed to have normally-off or normally-on functionality. A normally-off vertical JFET is particularly useful due to its ability to prevent current flow if no voltage is applied to the gate, which can serve as, among other things, a safety feature for vertical JFETs used in power applications.

A normally-off vertical JFET can be created in various ways. For example, an n-type current path from source to drain can be gated on either side by p+ gates. With sufficiently low background doping, and high positive charge due to high hole concentration in the p+ gates, the channel can be depleted of carriers, or pinched off at zero bias. When a positive voltage is applied to the gate(s), the channel can be re-opened to turn the device on. Thus, in embodiments of the present invention, the vertical JFET is referred to as a vertical junction field effect transistor since the current flows vertically between the source and drain through the gated region.

Whether the vertical JFET is normally-on or normally off can depend on different features of the vertical JFET, such as the width of the channel region, dopant concentrations in the channel region and the gate, and the like. For example, a normally-on vertical JFET can be formed if the channel region is sufficiently wide and/or the dopant concentrations are high enough, in which case the depletion regions may not pinch off the current when voltage $V_G$ applied to the gate is 0 V. The normally-on vertical JFET can be turned off when $V_G$ reaches a negative threshold voltage. Alternatively, for a normally-off vertical JFET, the channel is pinched off when $V_G$ is 0 V, and the normally-off vertical JFET can be turned on when $V_G$ reaches a positive threshold voltage. The manufacturing techniques described herein can apply to both normally-on and normally-off vertical JFETs.

In addition to the ability to support high-voltage, low-resistance JFET applications, the GaN vertical JFETs described herein can differ from traditional vertical JFETs in other ways. For example, other semiconductors used to manufacture vertical JFETs, such as SiC can be utilized, altering the mode of manufacture. Furthermore, the use of GaN epitaxial layers can allow for non-uniform dopant concentrations as a function of thickness within the various layers of the vertical JFET, which can optimize the performance of the device.

The manufacture of vertical JFETs can be carried out in a variety of ways. Traditional techniques can involve numerous photolithographic and etching steps, which, among other things can lengthen the time of manufacture. Techniques provided herein, however, include methods of manufacture that provide for a self-aligned source and gate while reducing the amount of photolithographic and etching steps. Moreover, embodiments provide for oxide spacers that can help prevent leakage current between the source and gate of the vertical JFET.

FIGS. 1-9 illustrate a process for creating a of vertical JFET that utilizes self-alignment techniques to form the gate and the source. Referring to FIG. 1, a first GaN epitaxial layer 120 is formed on a GaN substrate 110. As indicated above, the GaN substrate 110 can be a pseudo-bulk GaN material on which the first GaN epitaxial layer 120 is grown. Dopant concentrations (e.g., doping density) of the GaN substrate 110 can vary. For example, a GaN substrate 110 can have an n+ conductivity type, with dopant concentrations ranging from $1 \times 10^{17}$ cm$^{-3}$ to $1 \times 10^{19}$ cm$^{-3}$. Although the GaN substrate 110 is illustrated as including a single material composition, multiple layers can be provided as part of the substrate.

Moreover, adhesion, buffer, and other layers (not illustrated) can be utilized during the epitaxial growth process. One of ordinary skill in the art would recognize many variations, modifications, and alternatives.

The properties of the first GaN epitaxial layer 120 can also vary, depending on desired functionality. The first GaN epitaxial layer 120 can serve as a drift region and channel for the vertical JFET, and therefore can be a relatively low-doped material. In some embodiments, the dopant concentration of the first GaN epitaxial layer 120 is lower than the dopant concentration of the GaN substrate 110. For example, the first GaN epitaxial layer 120 can have an n-conductivity type, with dopant concentrations ranging from $1 \times 10^{14}$ $cm^{-3}$ to $1 \times 10^{18}$ $cm^{-3}$. Furthermore, the dopant concentration can be uniform, or can vary, for example, as a function of the thickness of the drift region and/or channel. In some embodiments, the first GaN epitaxial layer 120 can comprise two or more sublayers, which can have differing physical characteristics (e.g., dopant concentrations, dopant uniformity, etc.)

The thickness of the first GaN epitaxial layer 120 can also vary substantially, depending on the desired functionality. As discussed above, homoepitaxial growth can enable the first GaN epitaxial layer 120 to be grown far thicker than layers formed using conventional methods. For example, in some embodiments, thicknesses can vary between 0.5 μm to 100 μm or more. Resulting breakdown voltages for the vertical JFET can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, or the like. P-type dopants can include magnesium, beryllium, zinc, or the like.

A second GaN epitaxial layer 130 can be coupled to the first GaN epitaxial layer 120. The second GaN epitaxial layer 130, which eventually can comprise the source of the vertical JFET, can be a highly-doped epitaxial layer of the same conductivity type as the first GaN epitaxial layer 120 and the GaN substrate 110. In general, the dopant concentration of the second GaN epitaxial layer 130 can exceed the dopant concentration of the first GaN epitaxial layers 120. For example, an n-type dopant concentration of the second GaN epitaxial layer 130 can be equal to or greater than $1 \times 10^{18}$ $cm^{-3}$.

The thickness of the second GaN epitaxial layer 130 can impact the contact resistance and current flow properties of the vertical JFET. In some embodiments, thicknesses can be between 500 Å and 1 μm, for example 0.1 μm.

An first masking layer 140 is uniformly formed above the second GaN epitaxial layer 130. The first masking layer 140 can comprise any of a variety of materials, such as oxides and/or nitrides, which can be used as a mask in selective etching processes described below. The thickness of the first masking layer 140 can vary depending on composition and manufacturing concerns. In some embodiments the thickness of the first masking layer 140 is between about 0.1 μm and 5 μm.

In some embodiments, a second masking layer 150 may be uniformly formed above the first masking layer 140. Similar to the first masking layer 140, the second masking layer 150 can comprise any of a variety of materials that can be used as a mask in selective removal (e.g., etching) processes described below. For example, in some embodiments, the second masking layer 150 comprises polysilicon and/or another material with very high etch selectivity to the first masking layer 140. Here, too, the thickness of the second masking layer 150 can vary depending on composition, the subsequent etching processes, and other concerns. In some embodiments the thickness of the second masking layer 150 is between about 0.1 μm and 5 μm.

Figure 2:
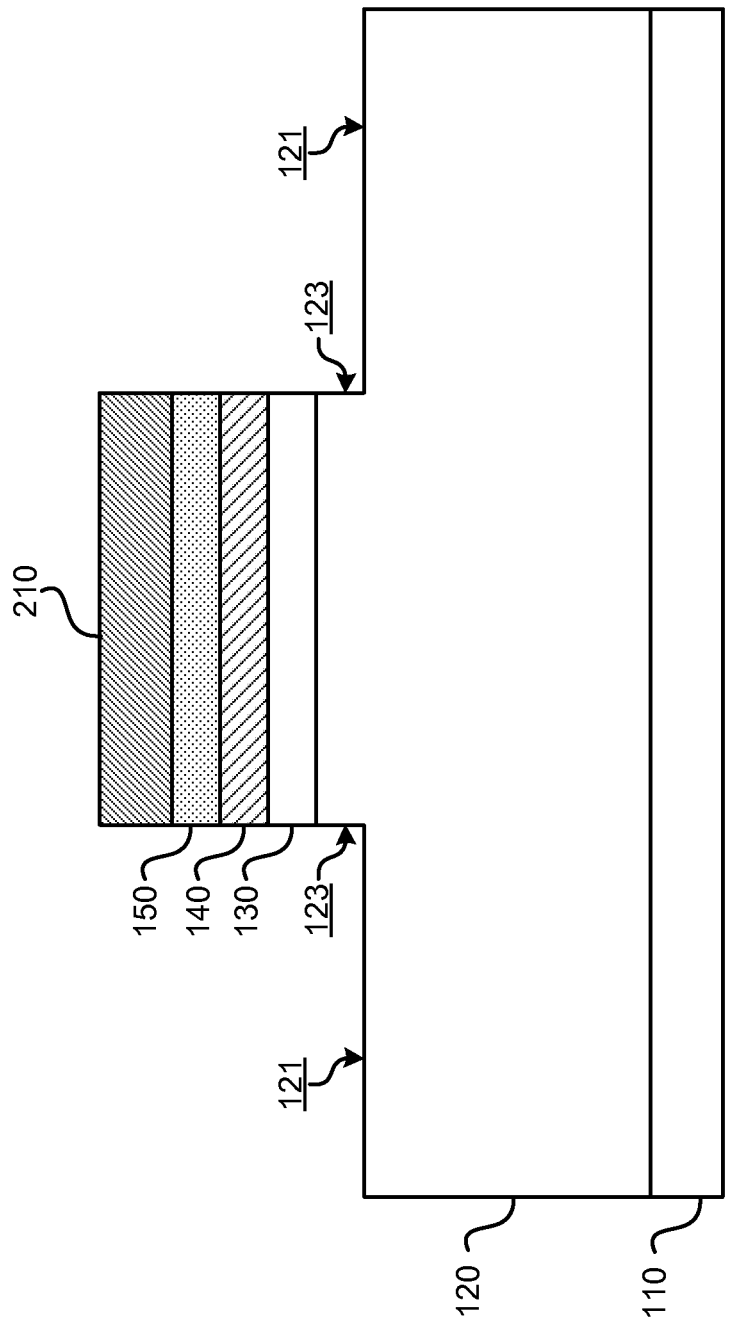

Referring to FIG. 2, a photoresist mask 210 is coupled to the second masking layer 150, and portions of the second masking layer 150, the first masking layer 140, and the second GaN epitaxial layer 130 are removed to expose a top surface 121 of the first GaN epitaxial layer 120. To help ensure that portions of the second GaN epitaxial layer 130 are fully removed, the removal process may also include removing portions of the first GaN epitaxial layer 120. This can create vertical surfaces 123 in the first GaN epitaxial layer 120, which can vary in depth, depending on the accuracy and tolerances of the removal process. For example, if the second GaN epitaxial layer 130 is 0.1 μm, the removal process may be configured to remove 0.15 μm of material, to ensure that portions of the second GaN epitaxial layer 130 are fully removed. In this example, this would lead to a depth of the vertical surfaces 123 of approximately 0.05 μm.

The removal of the second masking layer 150, the first masking layer 140, and the second GaN epitaxial layer 130 can involve a single etching process comprising a series of etching steps, which can reduce processing time. Because the different layers are composed of different materials, each etching step may include different gasses and other process parameters to change the etch rate of each layer in each etching step. For example, a first etching step may provide a high etch rate of second masking layer 150, a second etching step may provide a high etch rate for the first masking layer, and a third etching step may provide a high etch rate for the GaN layers 130 and 120.

Figure 3:
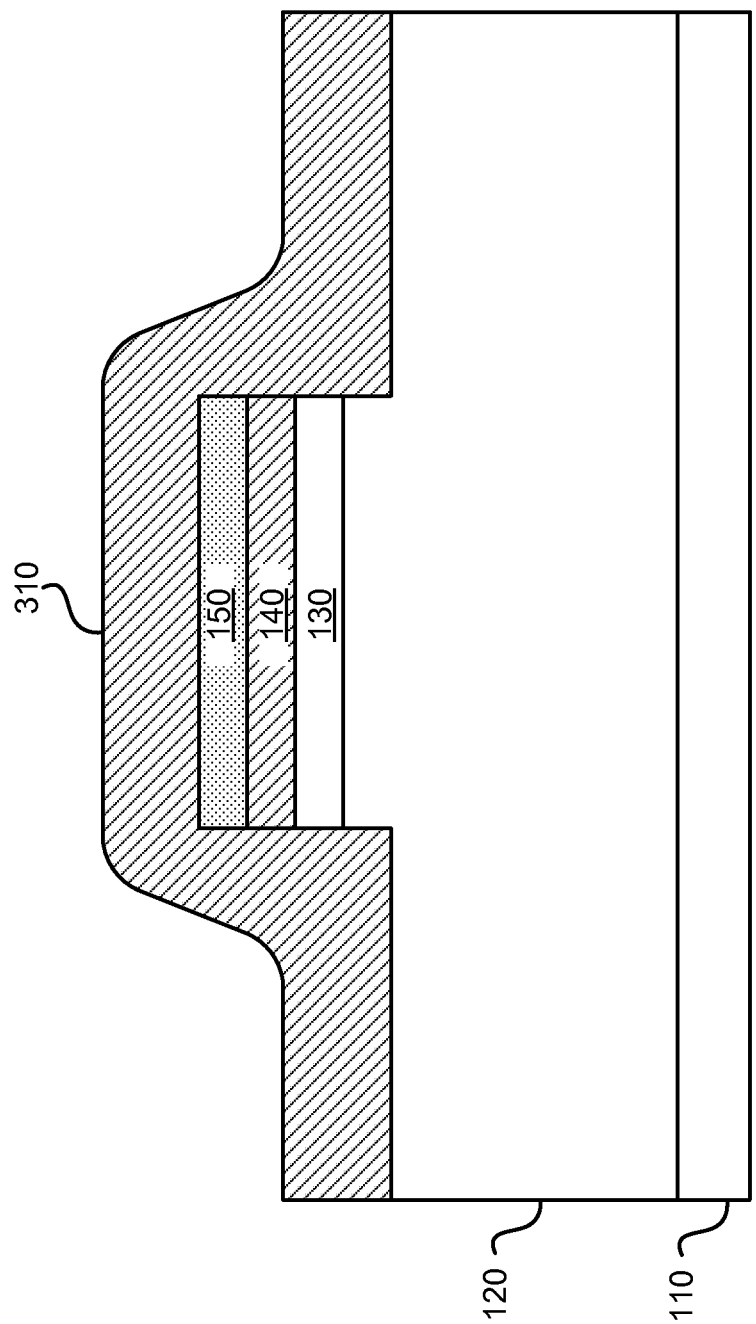
Figure 4:
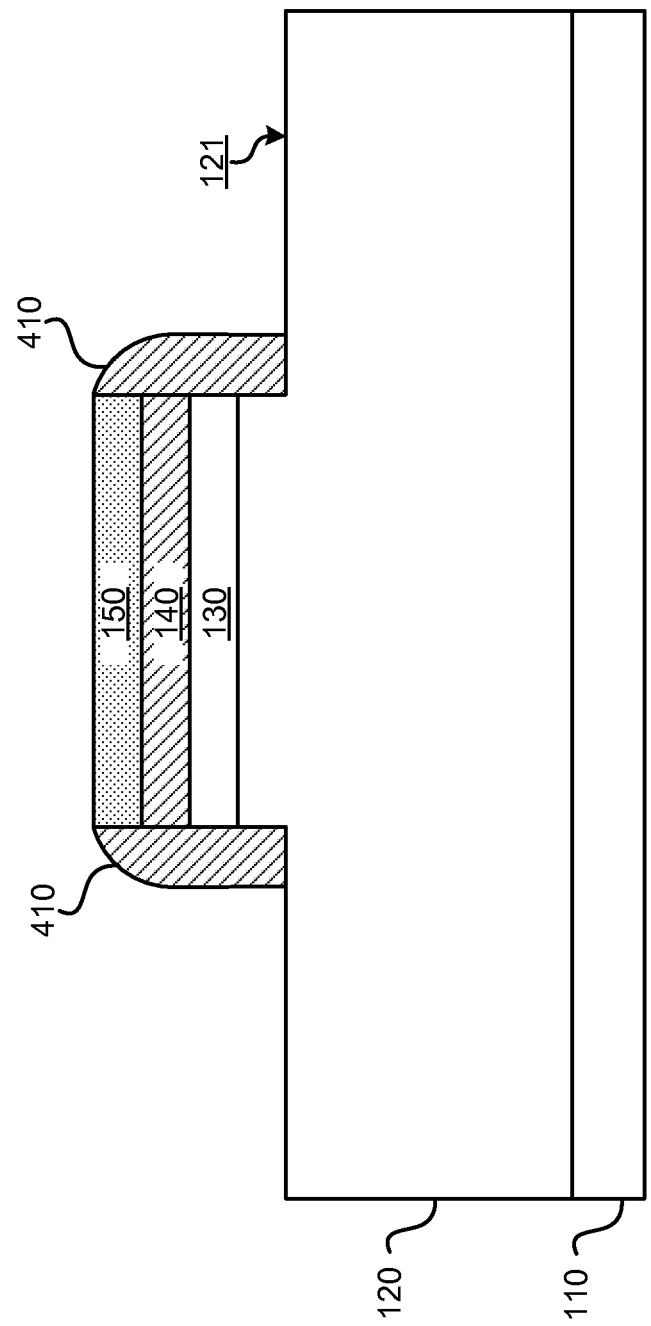

FIGS. 3 and 4 illustrate how a spacer layer 310 can be deposited and/or otherwise formed to cover the on the top surface 121 of the first GaN epitaxial layer 120, as well as the other structures, then removed (e.g., etched) to create spacers 410 that are coupled to the sides of the masking, insulating, and second GaN epitaxial layers 150, 140, 130. Spacer layer 310 may comprise an insulating material such as silicon dioxide, silicon nitride, or similar materials. The removal of portions of spacer layer 310 can include a dry etch, such as a Reactive-Ion Etching (RIE), that is selective to spacer layer 310, i.e. this etching step may have a much higher etch rate for spacer layer 310 than for GaN layer 120 and first masking layer 150. The second masking layer 150 can thus protect the first masking layer 140 from the etching process, so that first masking layer 140 is available to act as to protect GaN layer 130 is subsequent process steps. The deposition and anisotropic etching of spacer layer 310 results in a self-aligned process that creates one or more spacers 410 along the sidewalls of vertical surfaces 123 of GaN layers 130 and 120

Figure 5:
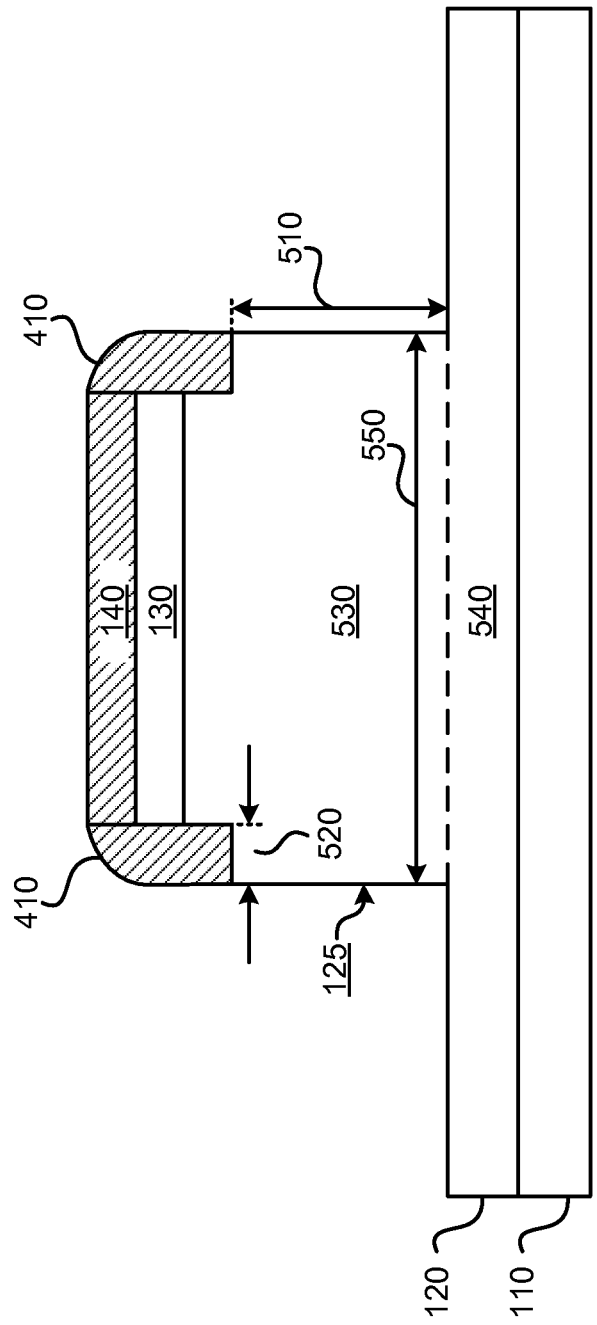

FIG. 5 is a simplified cross-sectional diagram illustrating the removal of at least a portion of the first GaN epitaxial layer 120 to form the channel region 530 and a drift region 540 in the process of manufacturing the vertical JFET. The removal can be performed by a controlled etch selective to GaN, i.e an etch in which GaN has a much higher etch rate than the first masking layer 140 and the spacers 410. In some embodiments, second masking layer 150 may be substantially etched or completely removed by this etching step. Masking layer 140 prevents this etching step from attacking the underlying portions of GaN layers 130 and 120. Inductively-coupled plasma (ICP) etching and/or other common GaN etching processes can be used. This results in the creation of a mesa in the first GaN epitaxial layer 120 that is laterally self-aligned to vertical surfaces 123 of the second GaN epitaxial layer 130, which forms the source of the vertical JFET.

The width 550 of channel region 530 can vary, depending on numerous factors such as desired functionality of the vertical JFET, dopant concentrations of channel region 530, as well as other factors. For example, for a normally-off vertical JFET in which the channel region 530 has a dopant concentration between $1 \times 10^{14}$ cm$^{-3}$ and $1 \times 10^{17}$ cm$^{-3}$, the width 550 of the channel region 530 can be between 0.5 μm and 10 μm. For a normally-on vertical JFET, the width 550 of the channel region 530 can be greater.

The removal of portion(s) of the first GaN epitaxial layer 120 additionally can determine the length 510 of the channel region 530, which can also vary depending on the desired functionality. For example, although a relatively long channel region 530 can provide increased control of the JFET, it also has increased resistivity, which can be undesirable in many applications. In some embodiments, length 510 can be between 0.25 μm and 10 μm.

The spacers 410 can provide electrical insulation between the source and gate structures of the vertical JFET. As such, the physical characteristics of the spacers 410 can be adjusted according to desired functionality. For example, according to some embodiments, the width 520 of the spacers 410 can be between 0.1 μm and 0.5 μm.

Figure 6:
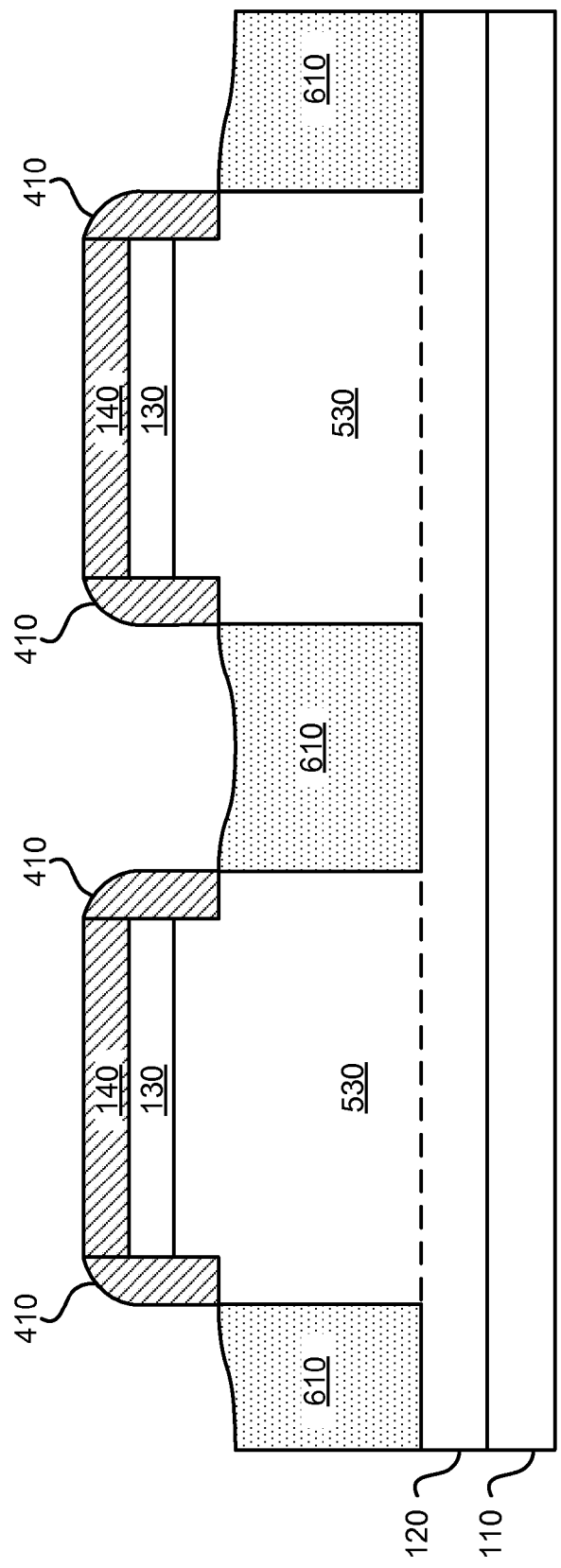

FIG. 6 illustrates the formation of gate structures 610 that together function as the gate for the vertical JFET. The gate structures 610 have a conductivity type different than the channel region 530. For instance, if the channel region 530 is formed from an n-type GaN material, the gate structures 610 will be formed from a p-type GaN material, and vice versa.

The gate structures 610 can be formed through a selective epitaxial regrowth process. Due to the composition of the spacers 410 and the first masking layer 140, GaN is inhibited from forming on the spacers 410 and first masking layer 140 during the epitaxial growth process. This results in the selective formation of the gate structures 610 in regions adjacent to the channel regions 530 of the JFETs (i.e., coupled to side surfaces of the mesa formed in the first GaN epitaxial layer 120), thereby forming gates in a self-aligned manner. Although the gate structures 610 of FIG. 6 are shown as having a top surface approximately level with a bottom surface of the spacers 410, this can vary among different embodiments. In some embodiments, the top surface of the gate structures 610 may be above or below the bottom surface of the spacers 410. Because the oxide spacer is disposed between the gate structures 610 and the second GaN epitaxial layer 130, it will provide electrical insulation between the source and gate of the vertical JFET, which can improve performance and prevent current leakage.

The gate structures 610 can be highly doped, for example in a range from about $5 \times 10^{17}$ cm$^{-3}$ to about $1 \times 10^{20}$ cm$^{-3}$. Additionally, as with other epitaxial layers, the dopant concentration of the gate structures 610 can be uniform or non-uniform as a function of thickness. In some embodiments, the dopant concentration increases with thickness, such that the dopant concentration is relatively low near the bottom surface of the gate structures 610 and increases as the distance from the bottom surface increases. Such embodiments provide higher dopant concentrations at the top of the gate structures 610 where metal contacts can be subsequently formed.

One method of forming the gate structures 610, and other layers described herein, can be through a regrowth process that uses an in-situ etch and diffusion preparation processes. These preparation processes are described in U.S. patent application Ser. No. 13/198,666, filed Aug. 4, 2011, entitled "METHOD AND SYSTEM FOR FORMATION OF P-N JUNCTIONS IN GALLIUM NITRIDE BASED ELECTRONICS," the entirety of which is hereby incorporated by reference.

Figure 7:
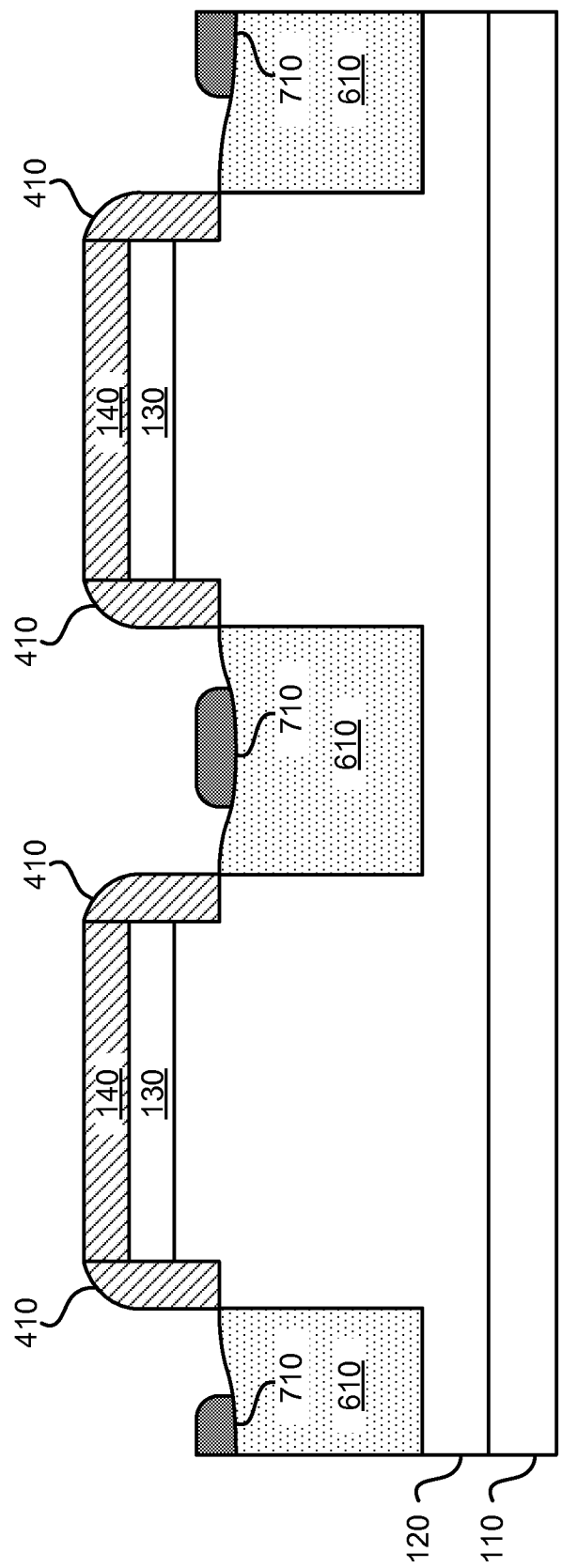

FIG. 7 illustrates the formation of one or more gate metal structures 710 on the gate structures 610 to form an electrical contact to the gates of the vertical JFETs. The gate metal structures 710 can include one or more layers of metal, including metals and/or alloys, configured to provide an ohmic contact to the gate structures 610. When p-type GaN is used for gate structures 610, for example, the bottom layer of gate metal structures 710 can comprise platinum, paladium, nickel, or similar ohmic metal. Other metals and/or alloys for the upper layers of metal structures 710 including, but not limited to, aluminum, titanium, nickel, gold, combinations thereof, or the like The gate metal structures 710 can be formed using any of a variety of methods such as sputtering, evaporation, or the like.

In FIG. 7, gate metal structures 710 are laterally separated from spacers 410, as would be the case if gate metal structures 710 were aligned using a photolithography process. In some embodiments, gate metal structures 710 may be deposited in a self-aligned manner, such that gate metal structures 710 cover substantially the entire exposed surfaces of gate structures 610.

Figure 8:
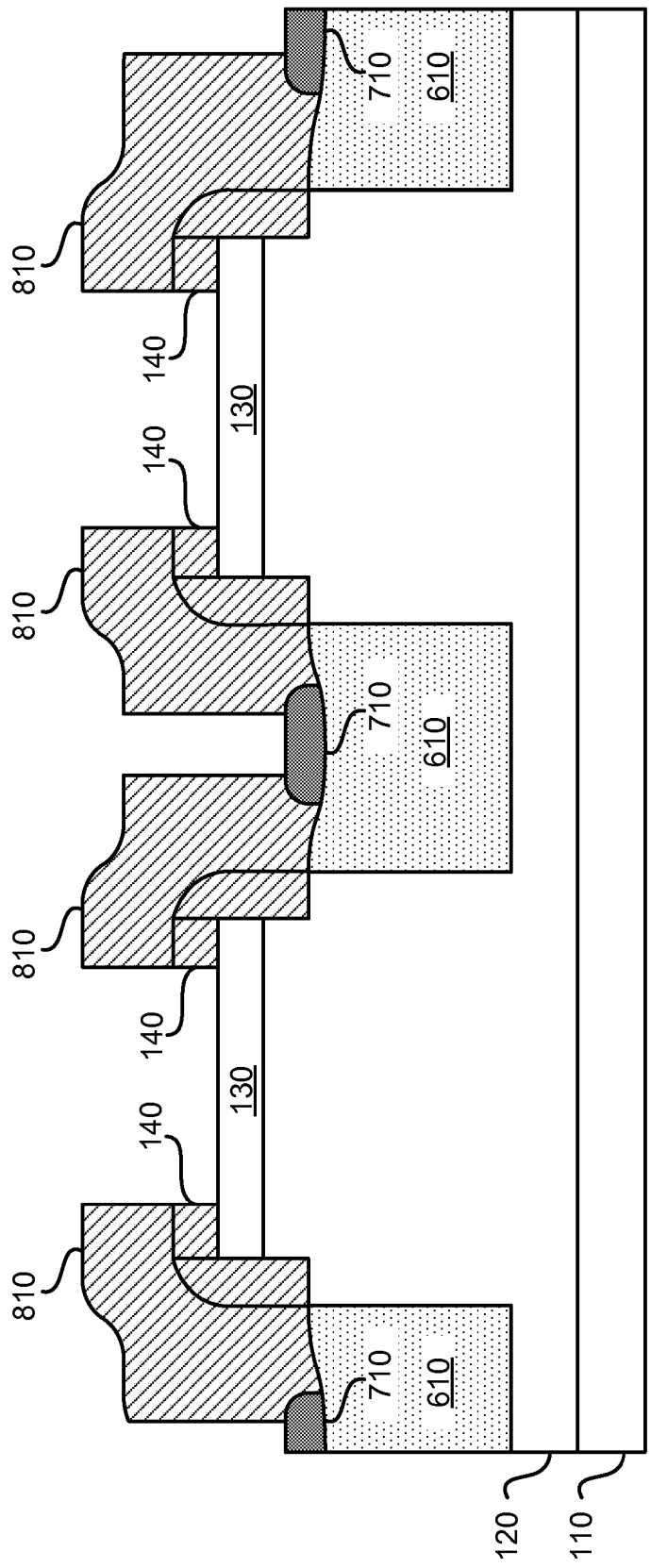

FIG. 8 illustrates how an inter-layer dielectric (ILD) 810 may be formed over the existing structures and etched (and/or subject to other material removal processes) to expose at least a portion of the metal structures 710 and/or the second GaN epitaxial layer 130. The ILD 810 can comprise any number of suitable dielectric layers, such as silicon dioxide, silicon nitride, spin-on glass, or other suitable materials, and the etch process may include the utilization of a photolithography and etching step to selectively etch portions of the ILD 810 to expose the metal structures 710 and/or the second GaN epitaxial layer 130.

In other embodiments (not shown), one or more additional masking processes may be used to form openings in the first masking layer 140 and then to form a source metal structure that makes ohmic contact to the second GaN epitaxial layer 130. These source metal structures and the gate metal structures 710 may then be covered by the ILD 810 and openings formed to expose portions of the gate metal structures 710 and the source metal structures (not shown).

Figure 9:
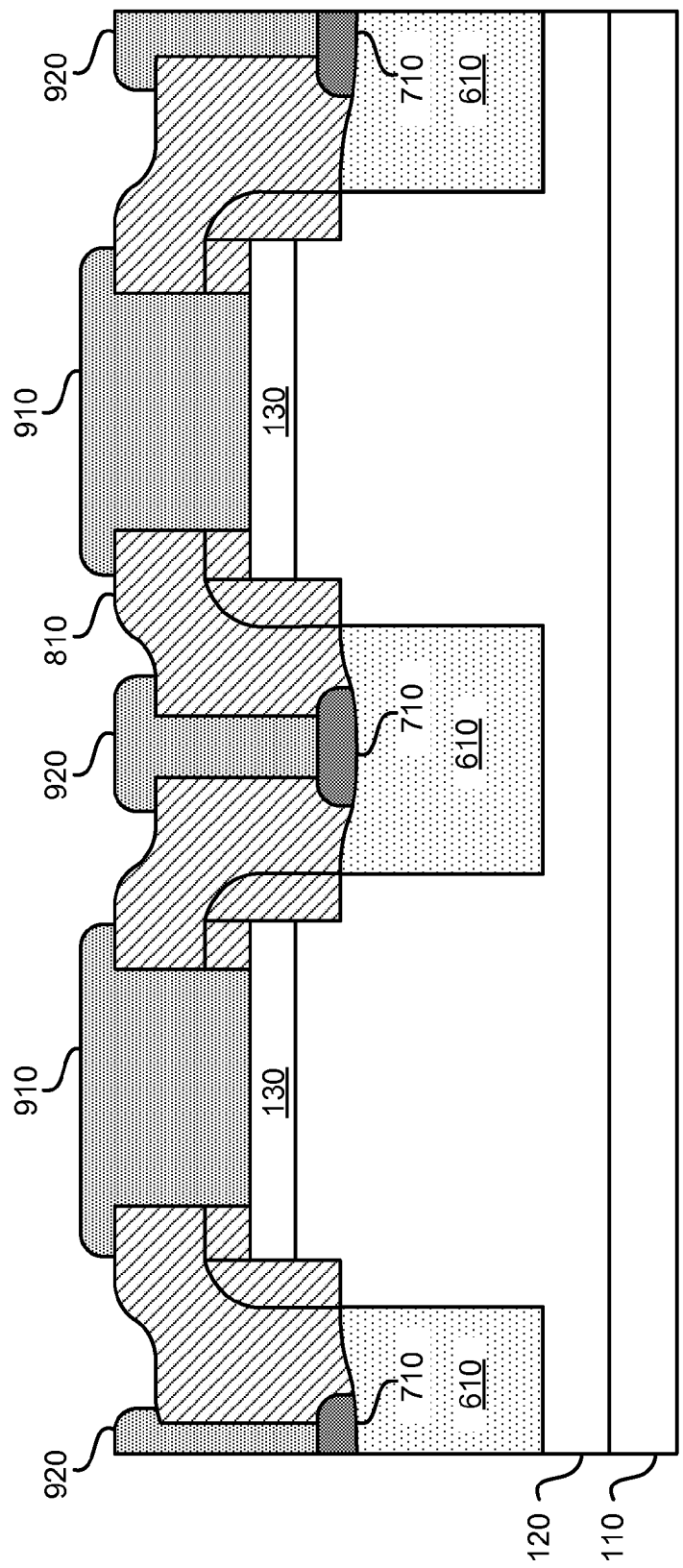

FIG. 9 illustrates the formation of one or more metal structures 910 to make electrical contact with the second GaN epitaxial layer 130, and the formation of one or more metal structures 920 to make electrical contact with the metal structures 710. In some embodiments, these metal structures 910, 920 may be formed at the same time, using the same materials. In such embodiments, the composition of the metal structures 910, 920 is such that it not only forms an ohmic metal contact with the second GaN epitaxial layer 130, but also forms a good contact with the metal structures 710 on the gate of the vertical JFET. In other embodiments, the etching and formation of metal structures 910, 920 can be separated such that metal structures 910 forming electrical contacts with the second GaN epitaxial layer 130 are formed separately from metal structures 920 forming electrical contacts metal structures 710, enabling different metals (and/or alloys) to be used for each type of metal structure 910, 920. The metal structures 910, 920 may include metals such as titanium, aluminum, nickel, gold, copper, or other suitable materials, and can be formed using any of a variety of methods such as sputtering, lift-off, evaporation, or the like.

The process shown in FIGS. 1-9 are provided as an example only, and are not limiting. Furthermore, the figures are not drawn to scale, and the manufacture of the vertical JFETs can include additional steps and/or features that are not shown. For example, an ohmic metal contact may be created on the bottom of GaN substrate 110 to serve as the drain electrode of the JFET. The layers and/or structures described herein may include a number of sublayers, substructures, and/or other components to provide the functionality described herein. One of ordinary skill in the art would recognize many variations, modifications, and alternatives.

Figure 10A:
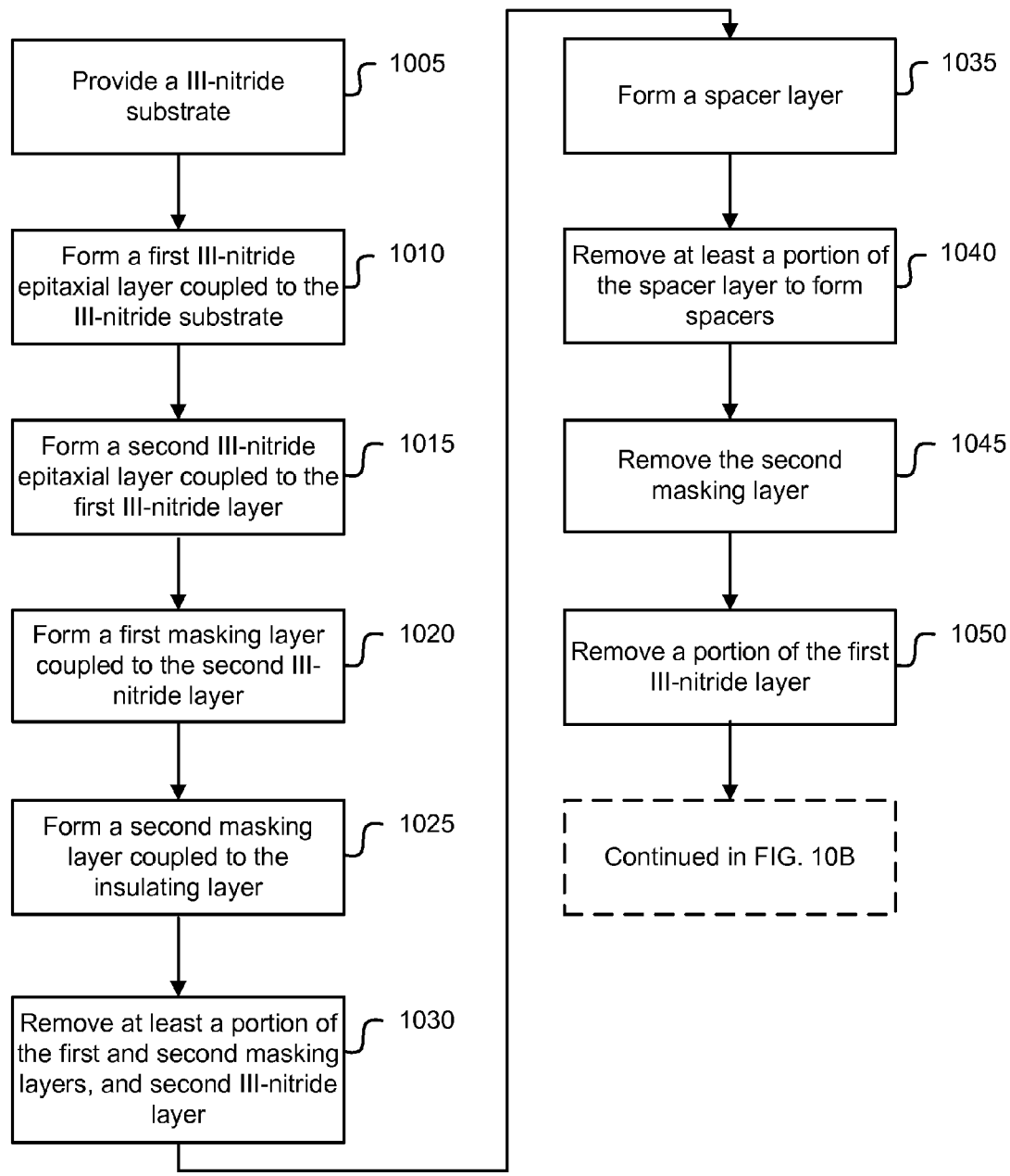
FIGS. 10A-10B are simplified flowcharts illustrating a method of fabricating a vertical JFET with self-aligned source and gate, according to one embodiment.
Figure 10B:
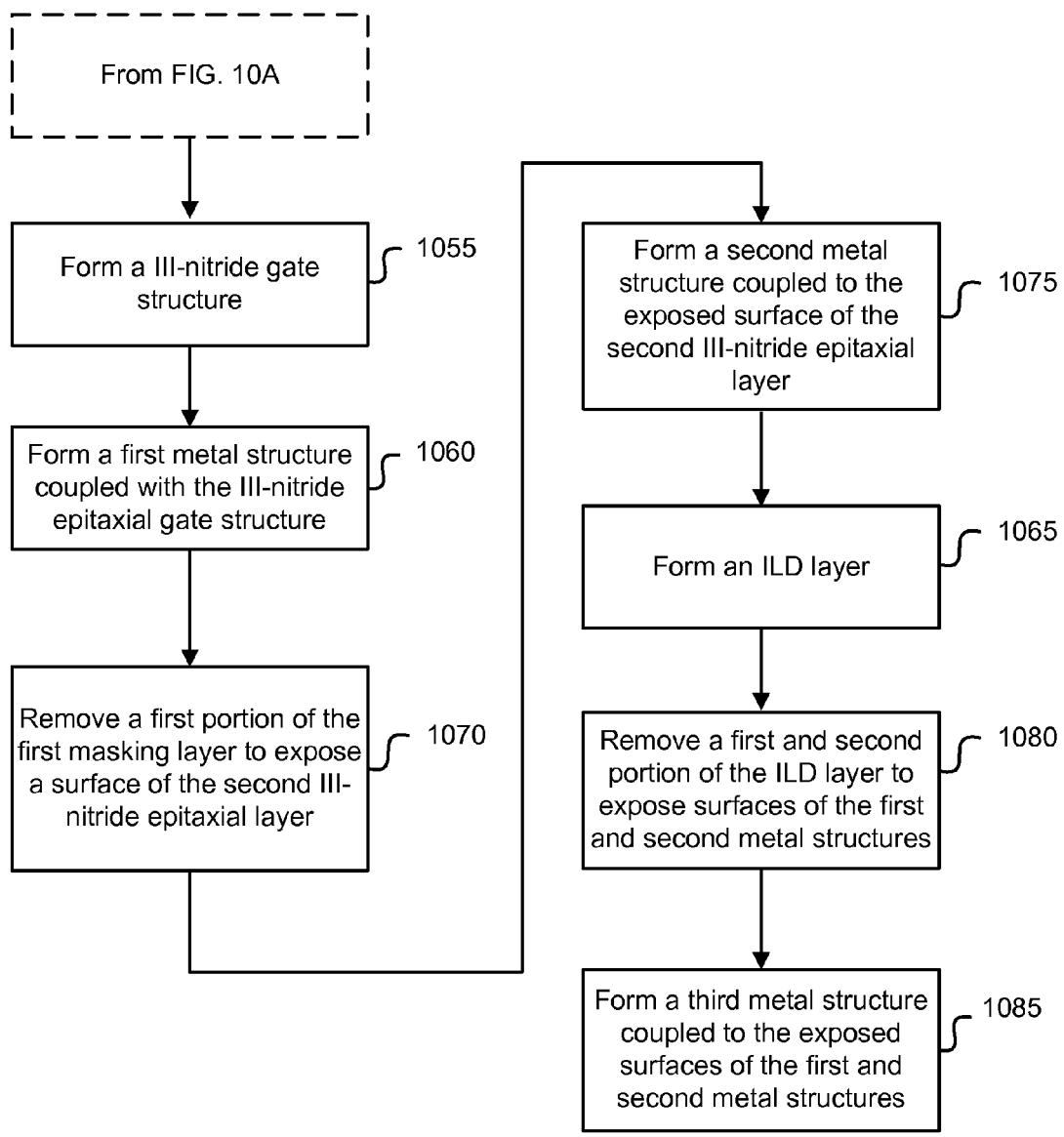

FIGS. 10A and 10B are simplified flowcharts illustrating a method of fabricating a vertical JFET with a self-aligned source and gate, according to an embodiment of the present invention. In some embodiments, the vertical JFET is referred to as a controlled switching device. Referring to FIG. 10A, a III-nitride substrate is provided (1005). In an embodiment, the III-nitride is an n-type GaN substrate. The method also includes forming a first III-nitride epitaxial layer (e.g., an n-type GaN epitaxial layer) coupled to the III-nitride substrate (1010). The first III-nitride epitaxial layer can be characterized by a first dopant concentration, for example n-type doping. Using the homoepitaxy techniques, the thickness of the first III-nitride epitaxial layer can be thicker than available using conventional techniques, for example, between about 3 μm and about 100 μm.

The method further includes forming a second III-nitride epitaxial layer (e.g., a GaN epitaxial layer) coupled to the first III-nitride epitaxial layer (1015). The second III-nitride epitaxial layer can have a second dopant concentration of the same type and greater than the first dopant concentration, for example, an n-type layer with a higher doping concentration than the first III-nitride epitaxial layer. The method further includes forming an first masking layer (e.g., an oxide and/or nitride) coupled to the second III-nitride layer (1020), and forming a second masking layer coupled to the first masking layer (1025). As described above, the second masking layer can protect the first masking layer during subsequent selective etches that would otherwise remove portions of the first masking layer. As described above, the first masking layer can protect the first and second III-nitride epitaxial layers during subsequent selective etches that would otherwise remove portions of the III-nitride epitaxial layers.

The method further includes removing at least a portion of the first and second masking layers and second III-nitride epitaxial layer (1030), to expose a surface of the first III-nitride epitaxial layer. In some embodiments, a portion of the first III-nitride epitaxial layer is also removed during this step, such that the exposed surface is below the original surface of the first III-nitride epitaxial layer. As indicated previously, this removal process can be an etch that utilizes different precursor gasses to selectively etch the different layers during the removal process. It may also involve a masking and etching process that can include physical etching components as well as chemical etching components.

Additionally, the method includes forming an spacer layer (1035). The spacer layer can be an electrically insulating layer created using uniform deposition, growth, and/or other processes that result in the spacer layer covering the exposed structures, such as the masking layers and the vertical sidewalls and the exposed surface of the first III-nitride epitaxial layer. At least a portion of the spacer layer is then removed for form spacers (1040). The removal process can involve a selective etch step in which the second masking layer protects the first masking layer from being etched. The resulting spacers are self-aligned structures coupled to the vertical sidewalls of the stack of layers that includes the source (second III-nitride epitaxial layer) of the vertical JFET.

The process further includes removing the second masking layer (1045) and removing a portion of the first III-nitride layer (1050). The removal of the second masking layer and first III-nitride layer can occur in a single step, such as an etch that selectively etches both the III-nitride and the second masking layer, but does not completely etch the first masking layer. The removal of the portion of the first III-nitride layer results in the creation of the channel region of the vertical JFET, and the removal process can be configured accordingly. For example, the removal process can be a controlled etch configured to stop etching the first III-nitride layer at a depth of approximately the desired channel length of the vertical JFET.

It should be appreciated that the specific steps illustrated in FIG. 10A provide a particular method of fabricating a vertical JFET with a self-aligned source according to an embodiment of the present invention. Other sequences of steps may also be performed according to alternative embodiments. For example, alternative embodiments of the present invention may perform the steps outlined above in a different order. Moreover, the individual steps illustrated in FIG. 10A may include multiple sub-steps that may be performed in various sequences as appropriate to the individual step. Furthermore, additional steps may be added or removed depending on the particular applications. One of ordinary skill in the art would recognize many variations, modifications, and alternatives.

In another embodiment, the second masking layer may not be formed. Instead, the thickness of the first masking layer may be increased such that at least a portion of the first masking layer can survive the spacer etching process. In this manner, at least a portion of the first masking layer may still be present to protect the underlying portion of the first and second III-nitride epitaxial layers, without the need for a second masking layer.

FIG. 10B includes additional steps are provided for forming self-aligned gates, as well as passivation and metallization layers of the vertical JFET. These additional steps can be performed on the structure formed by the steps provided in FIG. 10A. Referring to FIG. 10B, a III-nitride gate structure is formed (1055). This can include, for example, a selective epitaxial regrowth process. In some embodiments, no additional masking process is needed due to the material properties of the spacers and first masking layer, which inhibit epitaxial growth, allowing for selective epitaxial growth coupled to the channel of the vertical JFET, forming a gate structure.

The additional steps further include forming a first metal structure coupled with the III-nitride epitaxial gate structure (1060). As indicated previously, the first metal structure can comprise any of a variety of metals to form an ohmic metal contact with the III-nitride epitaxial gate structure.

To form electrical contact to the source, a first portion of the first masking layer is removed to expose a surface of the second III-nitride epitaxial layer (1070), and a second metal structure is formed, coupled to the exposed surface of the second III-nitride epitaxial layer (1075). The second metal structure can comprise any of a variety of metals to form an ohmic metal contact on the second III-nitride epitaxial layer, creating an electrical contact to the source of the vertical JFET. An interlevel dielectric layer (ILD) is then formed (1065), which covers the the first metal structure and the second metal structure.

A first and second portion of the ILD layer are removed to expose a surface of first metal structure and the second metal structure (1080), and a third metal structure is formed, coupled to the exposed surfaces of the first metal structure and the second metal structure (1085). The third metal structure can comprise any of a variety of metals to create an ohmic contact to the first and second metal structures. The third metal structure can be patterned (e.g. by masking and etching or lift-off processing) so that the portion contacting the first metal structure (i.e. the gate electrode) is electrically isolated from the portion contacting the second metal structure (i.e. the source electrode).

It should be appreciated that the specific steps illustrated in FIG. 10B provide a particular method of fabricating a vertical JFET with a self-aligned source according to an embodiment of the present invention. Other sequences of steps may also be performed according to alternative embodiments. For example, alternative embodiments of the present invention may perform the steps outlined above in a different order. Moreover, the individual steps illustrated in FIG. 10B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 11:
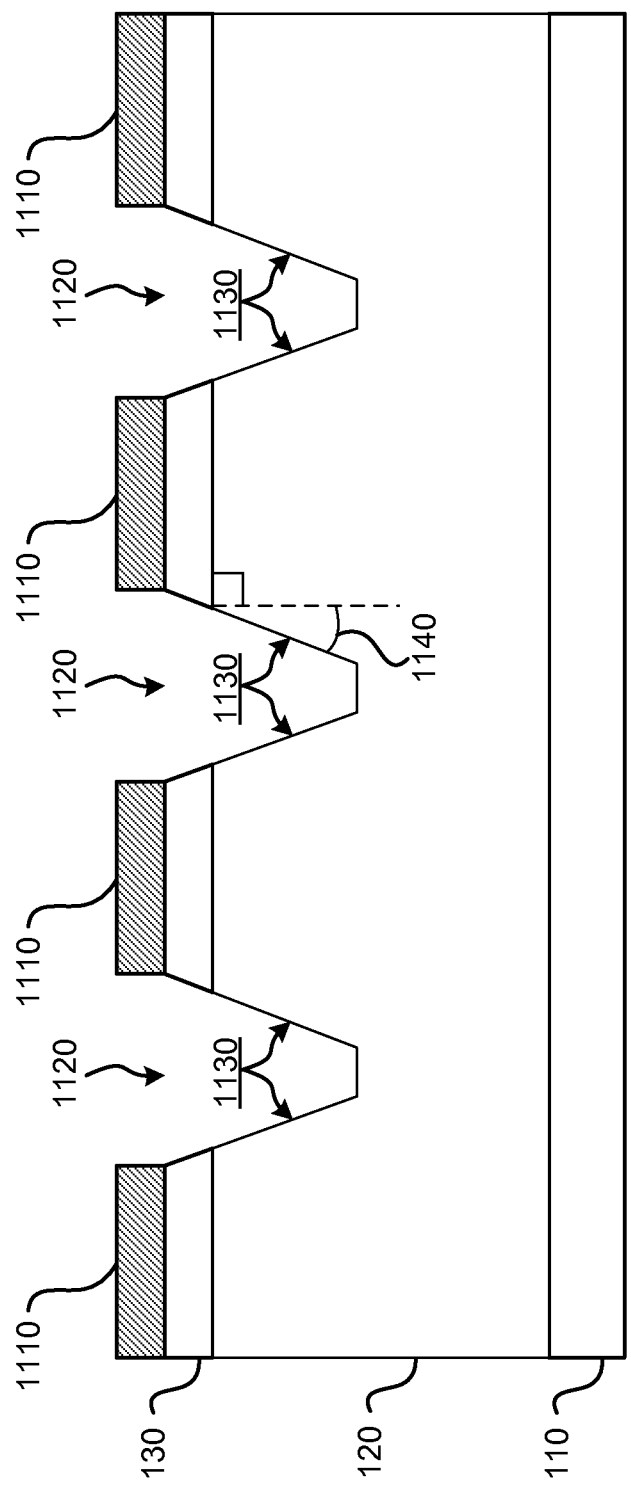
FIGS. 11-14 are simplified cross-sectional diagrams illustrating the fabrication of a vertical junction JFET according to another embodiment of the present invention.

FIGS. 11-14 are simplified cross-sectional diagrams illustrating an embodiment of an alternative process for creating a vertical JFETs having oxide spacers to provide electrical insulation between the gate and source of the vertical JFETs. Although the figures include more than one vertical JFET, the process described can refer to the manufacture of a single and/or isolated JFET. Referring to FIG. 11, a GaN substrate 110, a first GaN epitaxial layer 120, and a second GaN epitaxial layer 130 are provided in a manner similar to that described with reference to FIG. 1. Furthermore, physical characteristics (e.g., thicknesses, dopant concentrations, etc.) of the layers can be similar to those in the corresponding layers of FIG. 1. Here, however, portions of the first GaN epitaxial layer 120 and a second GaN epitaxial layer 130 are removed to create trenches 1120 between vertical JFETs with angled sidewalls 1130. Such a removal process can involve forming and patterning a photoresist layer 1110 followed by etch process. Inductively-coupled plasma (ICP) etching and/or other common GaN etching processes can be used.

The sidewalls 1130 form the sides of the vertical JFET channels and are angled in relation to a vertical direction (e.g., a direction normal to the top surface of the first GaN epitaxial layer 120) such that the subsequent formation of gate structures are coupled to the sidewalls, as discussed in more detail below. Among other things, ensuring the sidewalls 1130 are angled can facilitate deposition and/or regrowth of subsequent layers. In some embodiments, the removal profile (e.g., the etch profile) can produce a reentrant profile. One of ordinary skill in the art would recognize many variations, modifications, and alternatives. The angle 1140 of the sidewalls 1130 may vary, depending on factors such as the type and accuracy of subsequent processing steps. According to some embodiments, the angle 1140 of the sidewalls 1130 is between about 1° and 45°. According to other embodiments, the sidewalls 1130 are not straight, but instead have varying (i.e., curved) slopes.

Figure 12:
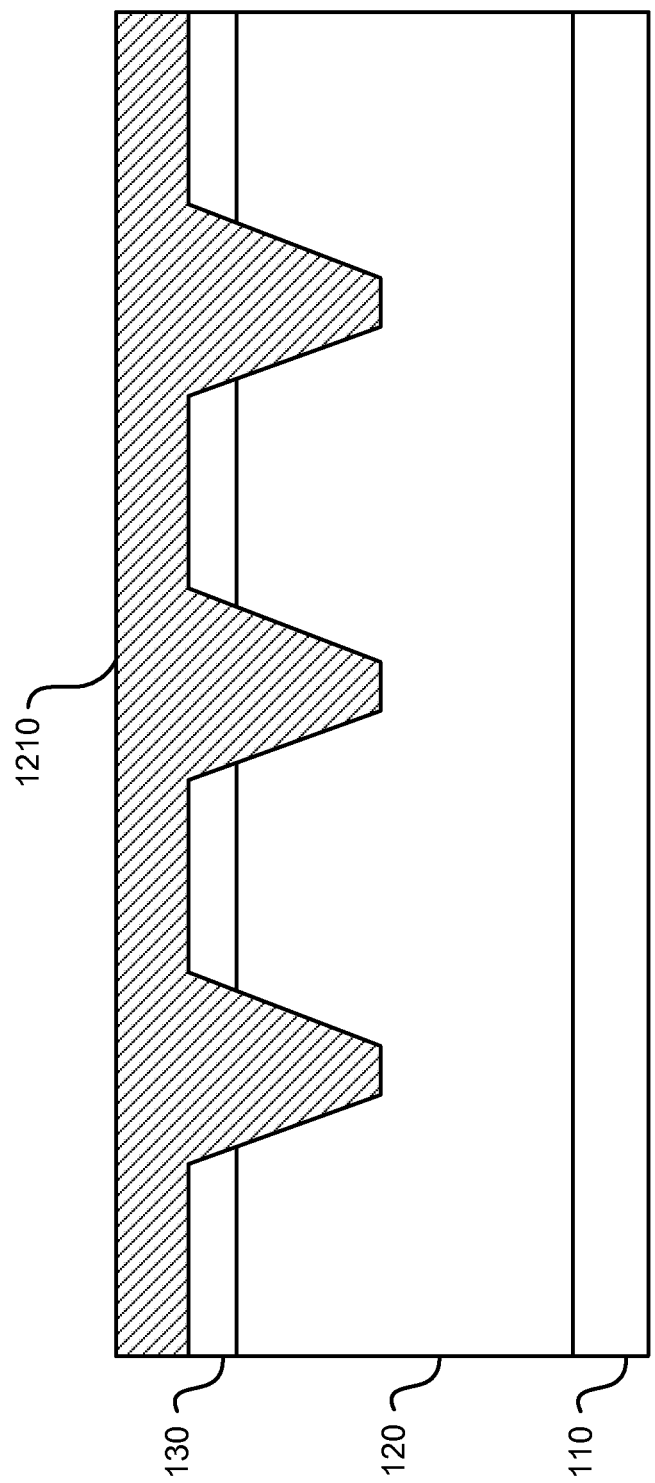

FIG. 12 illustrates the removal of photoresist layer 1110 and the formation of an insulating layer 1210. Similar to the first masking layer 140 of FIGS. 1-8, the insulating layer 1210 of FIG. 12 can comprise any of a variety of materials that can be used to provide electrical insulation between the source and gate of the vertical JFETs (e.g. an oxide layer, nitride layer, spin-on-glass, and/or other insulating layers). The thickness of the insulating layer 1210 can vary depending on composition and manufacturing concerns. In some embodiments the thickness of the oxide layer 1210 is between about 0.1 µm and 5 µm.

Figure 13:
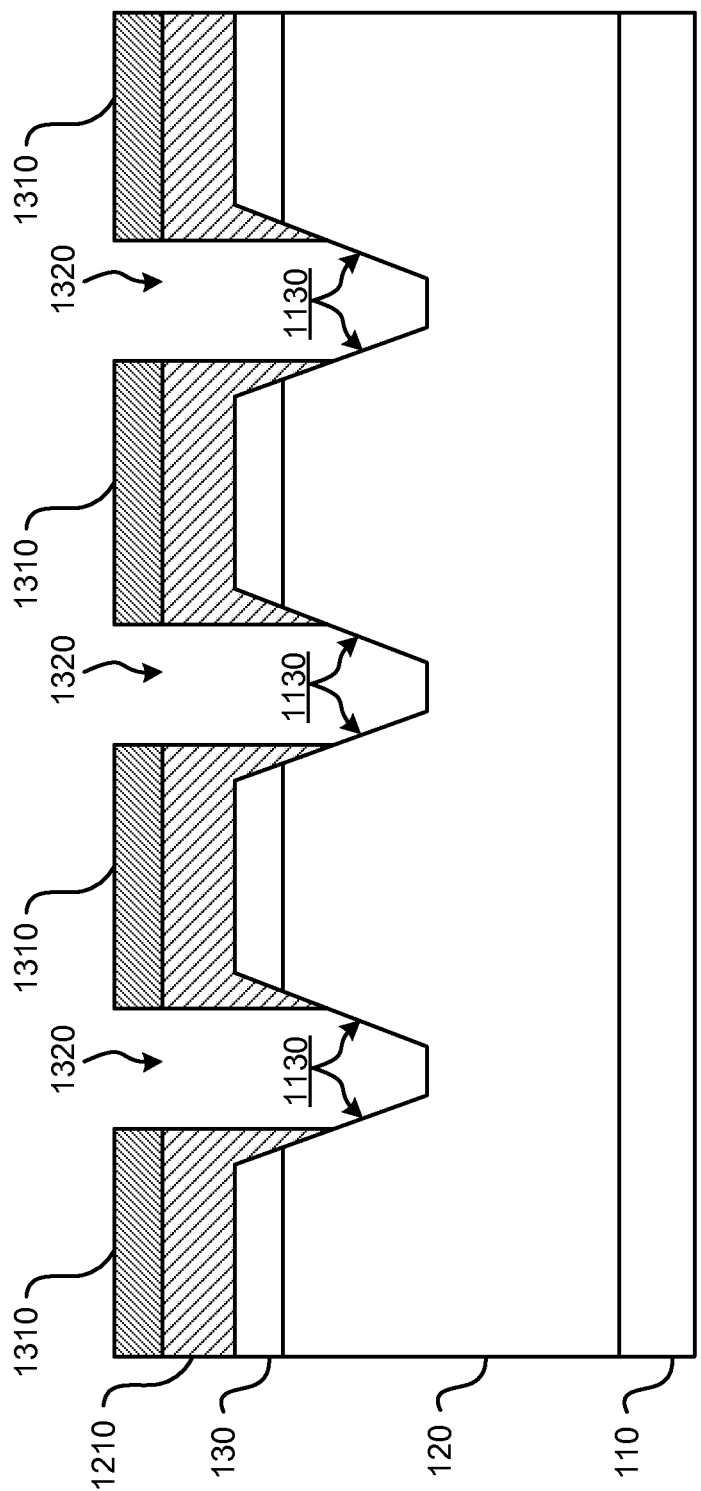

FIG. 13 illustrates the removal of portions of the insulating layer 1210 to form trenches 1320 that expose the sidewalls 1130. The removal process can comprise the formation and patterning of a photoresist mask 1310 followed by a dry etch, such as an RIE selective to the insulating layer. Not only can the removal process expose the sidewalls 1130, but it can be configured such that portions of the insulating layer 1210 form spacers between the second GaN epitaxial layer 130 and the trenches 1320. Because the gates of the vertical JFETs will be formed in the trenches 1320, this allows for electric isolation between the sources and gates of the vertical JFETs.

Figure 14:
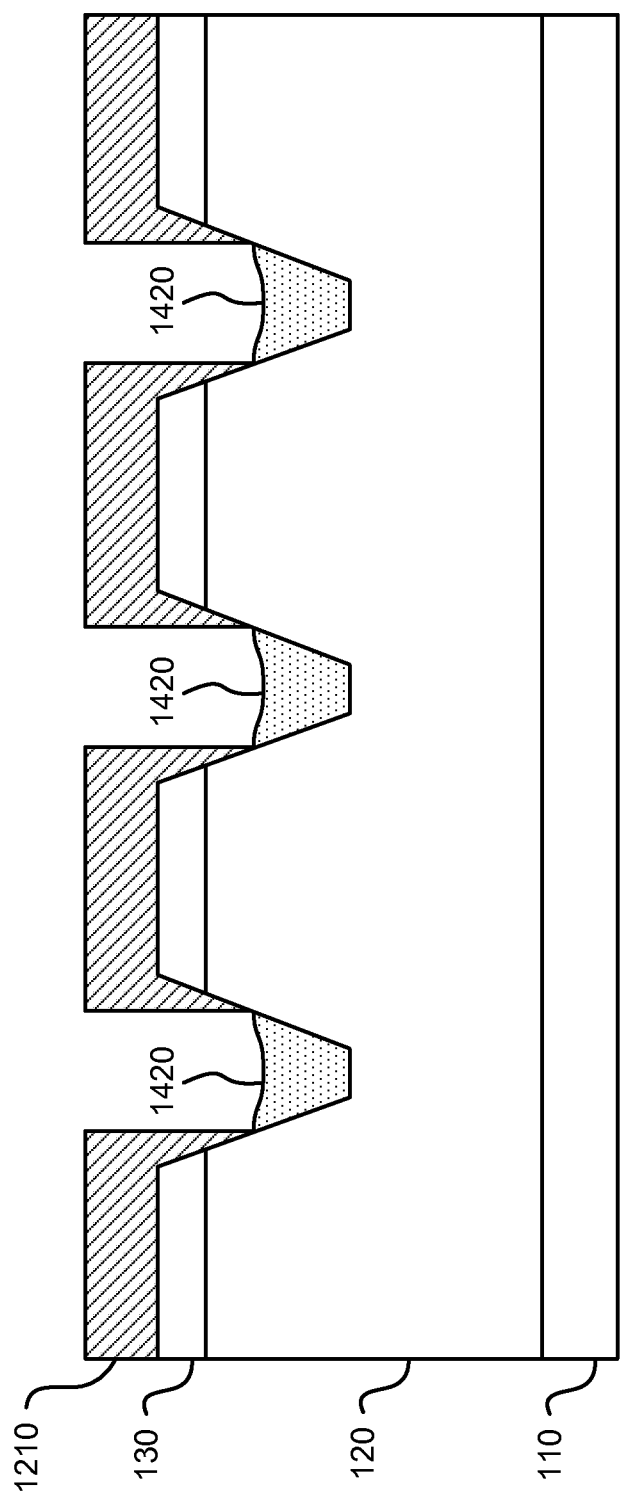

FIG. 14 illustrates the formation of the gates 1420 of the vertical JFETs, as well as the removal of the photoresist mask 1310 of FIG. 13. The gates 1420 can be epitaxial GaN structures having a conductivity opposite from the conductivity of the first GaN epitaxial layer 120. For example, where the first GaN epitaxial layer is an n-type GaN, the gates 1420 can comprise p-type GaN.

The gates 1420 can be formed through a selective epitaxial regrowth process, similar to the process described in relation to FIG. 6. For example, during the selective epitaxial regrowth process, GaN is inhibited from forming on the insulating layer 1210, but forms on the sidewalls 1130 of the JFET channels, allowing the resulting GaN structures to form the gates 1420. Although the gates 1420 are shown as having a top surface approximately level with a bottom of the spacers, embodiments can include resulting GaN structures with top surfaces that are above and/or below the bottom surface of the spacer 1210.

Subsequent metallization and passivation can be performed through steps similar to those discussed in relation to FIGS. 7-9. Thus, the process shown in FIGS. 11-14 can provide for spacers that can prevent leakage in vertical JFETs between the source and gate, similar to the process described in relation to FIGS. 1-9. The process of FIGS. 11-14, however, does not utilize additional masking and insulating layers to create a self-aligning process.

Figure 15:
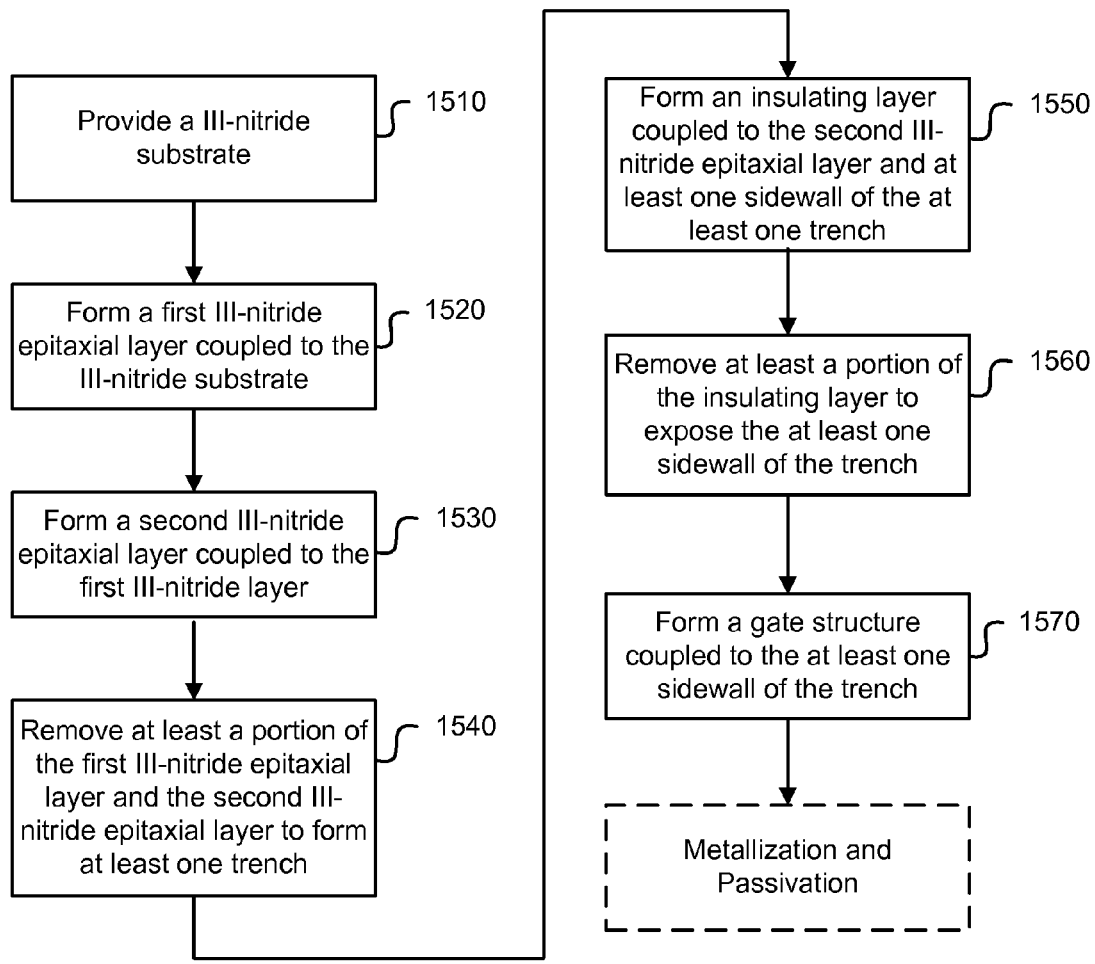
FIG. 15 is a simplified flowchart illustrating a method of fabricating a vertical JFET with oxide spacers, according to another embodiment of the present invention.

FIG. 15 is a simplified flowchart illustrating a method of fabricating a vertical JFET with a spacers according to an embodiment of the present invention. Similar to the methods shown in FIG. 10A, the method of FIG. 15 includes providing a III-nitride substrate (1510), forming a first III-nitride epitaxial layer coupled to the III-nitride substrate (1520), and forming a second III-nitride epitaxial layer coupled to the first III-nitride epitaxial layer (1530). As discussed earlier, the physical properties of the III-nitride substrate, first III-nitride epitaxial layer, and second III-nitride epitaxial layer, can be similar to corresponding layers in the embodiment shown in FIG. 1.

At least a portion of the first III-nitride epitaxial layer and the second III-nitride epitaxial layer is removed to form at least one trench (1540). As discussed above, the sidewalls are angled and/or otherwise sloped to allow subsequent processing steps to form oxide spacers and gate structures coupled with the sidewalls. The method further includes forming an insulating layer (e.g., a layer comprising and oxide and/or nitride) coupled to the second III-nitride epitaxial layer and at least one sidewall of the at least one trench (1550). The insulating layer can be used later to form spacers and create a mask during subsequent selective epitaxial regrowth step(s). In certain embodiments, the insulating layer may comprise multiple insulating sublayers.

At least a portion of the insulating layer is removed to expose at least a portion of the at least one sidewall of the trench (1560). As explained above, this allows for a gate to be subsequently coupled with the at least one sidewall, which forms the gate of the vertical JFET. Furthermore, the removal process (which can be an RIE or other dry etch) can be configured such that spacers are disposed between the exposed sidewall and the first III-nitride epitaxial layer forming the source of the vertical JFET. The method further includes forming a gate structure coupled to the at least one sidewall of the trench (1570). Because the insulating layer can prohibit GaN growth during an epitaxial regrowth process, the process may not need to include the formation of a separate mask before regrowth.

It should be appreciated that the specific steps illustrated in FIG. 15 provide a particular method of fabricating a vertical JFET with a self-aligned source according to an embodiment of the present invention. Other sequences of steps may also be performed according to alternative embodiments. For example, alternative embodiments of the present invention may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device comprising:
a III-nitride substrate;
a first III-nitride epitaxial layer coupled to the III-nitride substrate and having a mesa;
a second III-nitride epitaxial layer coupled to a top surface of the mesa;
a III-nitride gate structure contacting a side surface of the mesa; and
a spacer configured to provide electrical insulation between the second III-nitride epitaxial layer and the III-nitride gate structure, wherein the spacer overlaps the mesa.

2. The semiconductor device of claim 1 wherein:
the III-nitride substrate, the first III-nitride epitaxial layer, and the second III-nitride epitaxial layer are of a first conductivity type; and
the III-nitride gate structure is of a second conductivity type.

3. The semiconductor device of claim 1 further comprising:
a first metal structure coupled to the III-nitride gate structure; and
a second metal structure coupled to the second III-nitride epitaxial layer.

4. The semiconductor device of claim 3 further comprising:
a third metal structure coupled to the first metal structure and the second metal structure; and
a dielectric layer disposed between the third metal structure and at least a portion of the first metal structure and the second metal structure.

5. The semiconductor device of claim 1 wherein:
the semiconductor device comprises a vertical JFET;
the III-nitride substrate comprises a drain of the vertical JFET;
the second III-nitride epitaxial layer comprises a source of the vertical JFET; and
the III-nitride gate structure comprises a gate of the vertical JFET.

6. The vertical JFET of claim 5 wherein:
a drift region of the vertical JFET is formed by the first III-nitride epitaxial layer; and
a channel region of the vertical JFET is formed by the mesa.

* * * * *